(12) United States Patent
Kazama (10) Patent No.: US 7,459,917 B2
(45) Date of Patent: *Dec. 2, 2008

(54) MEASURING METHOD FOR ELECTROMAGNETIC FIELD INTENSITY AND APPARATUS THEREFOR, MEASURING METHOD FOR ELECTROMAGNETIC FIELD INTENSITY DISTRIBUTION AND APPARATUS THEREFOR, MEASURING METHOD FOR CURRENT AND VOLTAGE DISTRIBUTIONS AND APPARATUS THEREFOR

(75) Inventor: Satoshi Kazama, Tokyo (JP)

(73) Assignee: Taiyo Yuden Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/939,765

(22) Filed: Nov. 14, 2007

(65) Prior Publication Data

US 2008/0079424 A1   Apr. 3, 2008

Related U.S. Application Data

(62) Division of application No. 10/474,375, filed as application No. PCT/JP02/03535 on Apr. 9, 2002, now Pat. No. 7,317,319.

(30) Foreign Application Priority Data

Apr. 9, 2001   (JP)   ............... 2001-110344

(51) Int. Cl.
 G01R 27/04   (2006.01)

(52) U.S. Cl. .......................................... 324/632; 324/72
(58) Field of Classification Search .................. 324/72, 324/632, 750
See application file for complete search history.

(56) References Cited

U.S. PATENT DOCUMENTS

| 5,231,346 A | 7/1993 | Gassman |
| 5,689,183 A | 11/1997 | Kohama |
| 7,098,677 B2 | 8/2006 | Kazama et al. |

FOREIGN PATENT DOCUMENTS

| JP | 2000-206163 | 7/2000 |
| JP | 2000-346886 | 12/2000 |

*Primary Examiner*—Vincent Q Nguyen
(74) *Attorney, Agent, or Firm*—Lowe Hauptman Ham & Berner LLP (57) ABSTRACT

A measuring method for electromagnetic field intensity capable of easily and accurately measuring, with a compact and simple facility, each of the electric field component and the magnetic field component of an electromagnetic field formed in space is to be provided. By simultaneously measuring output currents $O_1$ and $O_2$ from two ends of a measuring probe 20 and an output current R from a reference signal probe 30, the magnitudes of each of the output currents $O_1$ and $O_2$ and the phase difference of each of the output currents $O_1$ and $O_2$ from the output current R are measured, on the basis of the measurements the electric field component current generated from the electric field and the magnetic field component current generated from the magnetic field upon the measuring probe 20 are calculated, and on the basis of the calculated results the electric field intensity and the magnetic field intensity are figured out.

13 Claims, 9 Drawing Sheets

MEASURING METHOD FOR ELECTROMAGNETIC FIELD INTENSITY AND APPARATUS THEREFOR, MEASURING METHOD FOR ELECTROMAGNETIC FIELD INTENSITY DISTRIBUTION AND APPARATUS THEREFOR, MEASURING METHOD FOR CURRENT AND VOLTAGE DISTRIBUTIONS AND APPARATUS THEREFOR

RELATED APPLICATIONS

The present application is a divisional of U.S. application Ser. No. 10/474,375, filed Oct. 17, 2005, now U.S. Pat. No. 7,317,319, which is based on, and claims priority from, PCT/JP02/03535, filed Apr. 9, 2002, and JP 2001-110344, filed Apr. 9, 2001, the disclosures of which are hereby incorporated by reference herein in their entireties.

TECHNICAL FIELD

The present invention relates to a method for measuring the intensity of an electromagnetic field formed in space and an apparatus therefor.

BACKGROUND ART

As methods for measuring the intensity of an electromagnetic field due to an electromagnetic wave radiating from an electronic device to cope with EMI (electromagnetic interference), the following ones are set forth. For instance, the electronic device to be subjected to measurement, i.e. the sample device, is installed in an open space, and a loop antenna and a dipole antenna are installed at a distance of 3 m to 10 m from this sample device to carry out measurement. Where the antennas are installed at a sufficient distance from the sample device in this way, the loop antenna can measure only the magnetic field component of the distant radiating electromagnetic field while the dipole antenna can measure only the electric field component. Once one of the components of the distant radiating electromagnetic field is measured, the other can be calculated. There is also set forth a method by which measuring can be done in not only an open space but also an anechoic chamber.

On the other hand, in some cases, the radiation source of the electromagnetic wave is identified by the sample device. For instance, it may be determined on the circuit board what region the electromagnetic wave is powerfully radiated from. In such a case, unlike in the above-described case of measurement, the electromagnetic field intensity is measured in the vicinity of the sample device. Usually, a small loop antenna is brought close to the sample device to measure the magnetic field component of the electromagnetic field. Thus, the magnetic field component of the electromagnetic field attributable to the sample device is measured by utilizing a dielectric electromotive force due to inductive coupling. Whereas the magnitude and phase of signals are calculated by putting the magnetic field component thereby measured to arithmetic operation, instruments according to the prior art for measuring the magnetic field component in this manner include vector network analyzers and vector signal analyzers. One or another of such instruments is used to assess the characteristics of sensors and measure the distribution of harmonics in ICs, on the basis of which the current and voltage distributions in the sample device are figured out to identify the radiation source.

Incidentally, the aforementioned measuring method using an open space or the like requires a vast installation space and a large amount of facility investment. In view of this problem, an evaluation method using a coaxial transmission line known as a TEM cell has come to attract notice for the evaluation of the intensity of radiating electromagnetic waves. According to this evaluation method, the sample device is arranged between the internal conductor and the external conductor of the coaxial transmission line, and the evaluation is made according to the output from one end of the internal conductor. This method has the advantage of permitting evaluation with a relatively small facility.

However, the method using the TEM cell involves the problem of impossibility to correlate its measurements with those in an open space. Thus, because the distance between the sample device and the internal conductor is so short, the output current from the TEM cell cannot be considered-negligible without regard to the current due to inductive coupling and that due to capacitive coupling.

On the other hand, in order to identify the radiation source of the electromagnetic wave accurately by using the loop antenna, it is necessary to eliminate any influence of the electric field component. A shielded loop antenna, which is a loop antenna provided with a shield, is frequently used. Since this shielded loop antenna is hardly influenced by the electric field component, it is possible to measure only the magnetic field component with relatively high precision.

However, even with a shielded loop antenna it is difficult to measure only the magnetic field component accurately because an unshielded part of its structure is subject to electric field coupling with the sample device. Furthermore, the structural feature of having a shielded part makes it difficult to reduce the size of the antenna. Thus, it is difficult to improve the resolution. Also, since signals radiated from the sample device are actually unstable in frequency and some of them are modulated signals, it is extremely difficult to measure the phases of these signals and their electromagnetic field components.

An object of the present invention, attempted in view of the circumstances noted above, is to provide a measuring method for electromagnetic field intensity and an apparatus therefor, a measuring method for electromagnetic field intensity distribution and an apparatus therefor, and a measuring method for current and voltage distributions and an apparatus therefor, all capable of easily and accurately measuring with a compact and simple facility each of the electric field component and the magnetic field component of the electromagnetic field formed in space.

Another object of the invention is to provide a measuring method for electromagnetic field intensity and an apparatus therefor, a measuring method for electromagnetic field intensity distribution and an apparatus therefor and a measuring method for current and voltage distributions and an apparatus therefor, all permitting ready and reliable realization of the measurement of phases of signals radiated from the sample device, even if they are unstable in frequency as referred to above.

DISCLOSURE OF THE INVENTION

In order to achieve the objects, stated above, the present invention provides a method by which the electric field intensity and the magnetic field intensity of an electromagnetic field are measured, characterized in that a conductor is arranged within the electromagnetic field; by simultaneously measuring a plurality of output currents emitted from the conductor in different directions relative to the electromagnetic field, the magnitude of each output current and the phase differences between the output currents are measured; the electric field component current generated in the conductor generated by the electric field contained in each output current and the magnetic field component current generated in the conductor by the magnetic field are calculated on the basis of the measured magnitudes of and phase differences between the plurality of output currents; and the electric field intensity and the magnetic field intensity of the electromagnetic field are calculated on the basis of the calculated magnitudes of the electric field component current and the magnetic field component current.

Generally, when a conductor is arranged in a space in which an electromagnetic field is formed, there is outputted a composite current of a current generated by an electric field (electric field component current) and a current generated by a magnetic field (the magnetic field component current) both from the conductor. Here, out of the currents outputted from a specific portion of the conductor, the electric field component current is constant even if the conductor changes its direction relative to the electromagnetic field. On the other hand, out of the currents outputted from the specific portion of the conductor, the magnetic field component current will vary in magnitude and direction (phase) if the conductor changes its direction relative to the electromagnetic field.

The present invention makes it possible, by simultaneously measuring a plurality of output currents emitted from a conductor in directions differing from one another, to measure their magnitudes of and the differences in phase between the output currents. And, since it calculates the electric field component current and the magnetic field component current contained in the output currents on the basis of the magnitude of each output current and the differences in phase between the output currents, the electromagnetic field intensity in the position of the conductor can be accurately measured.

BEST MODE FOR CARRYING OUT THE INVENTION

First Mode for Carrying Out the Invention

Figure 1:
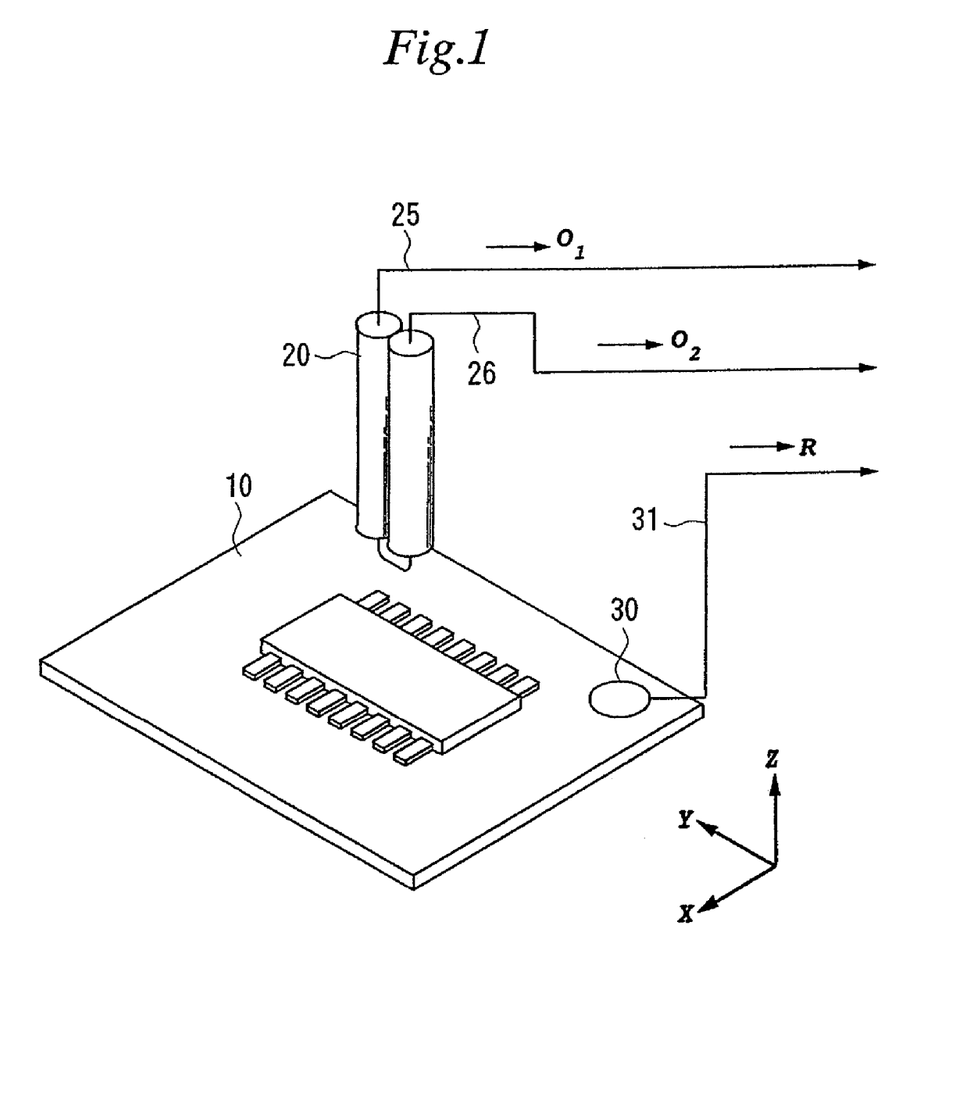
FIG. 1 is a diagram illustrating the configuration of an apparatus for measuring the distribution of electromagnetic field intensities pertaining to a first mode for carrying out the invention.
Figure 2:
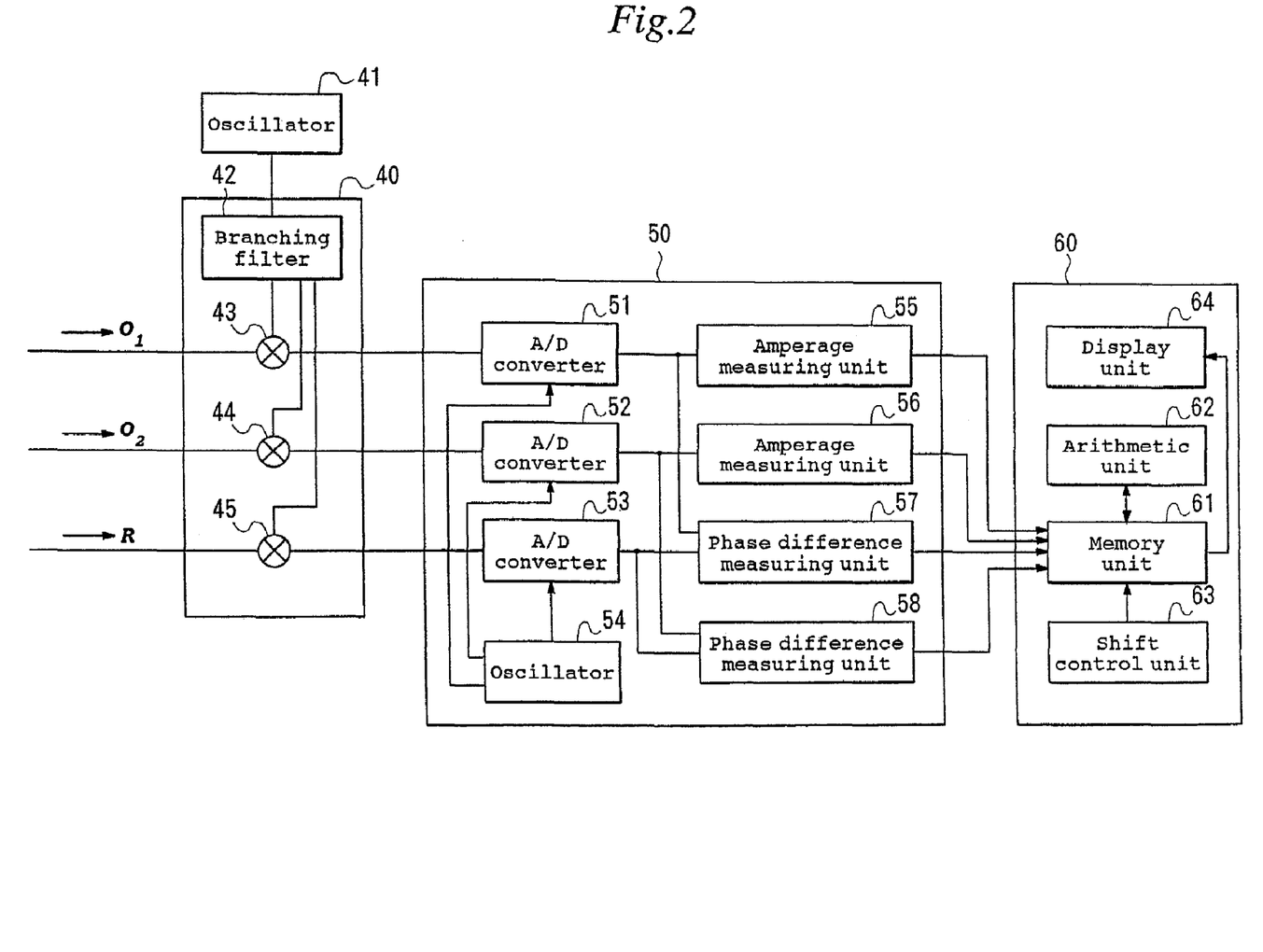
FIG. 2 is a diagram illustrating the configuration of the apparatus for measuring the distribution of electromagnetic field intensities pertaining to the first mode for carrying out the invention.
Figure 3:
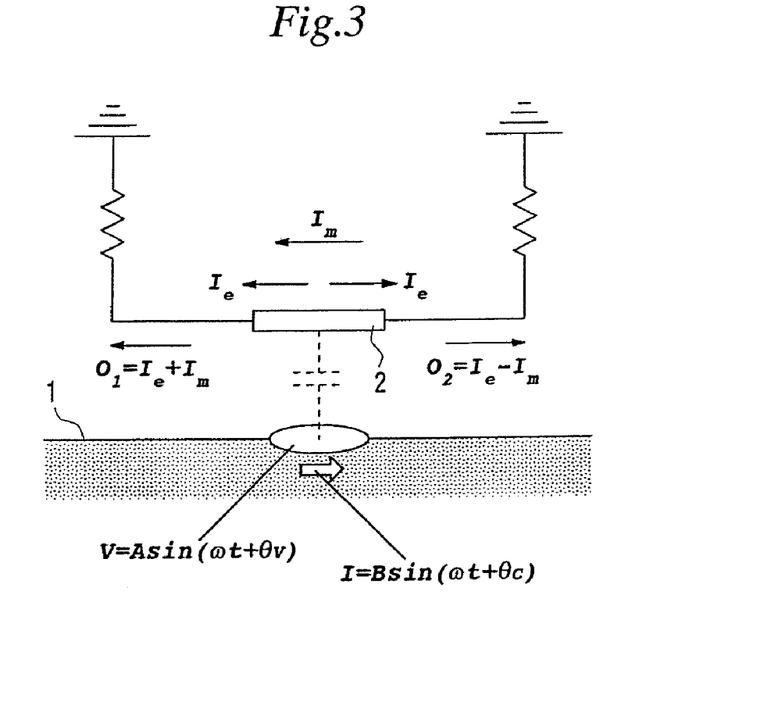
FIG. 3 is a diagram illustrating the working principle of the invention.
Figure 4:
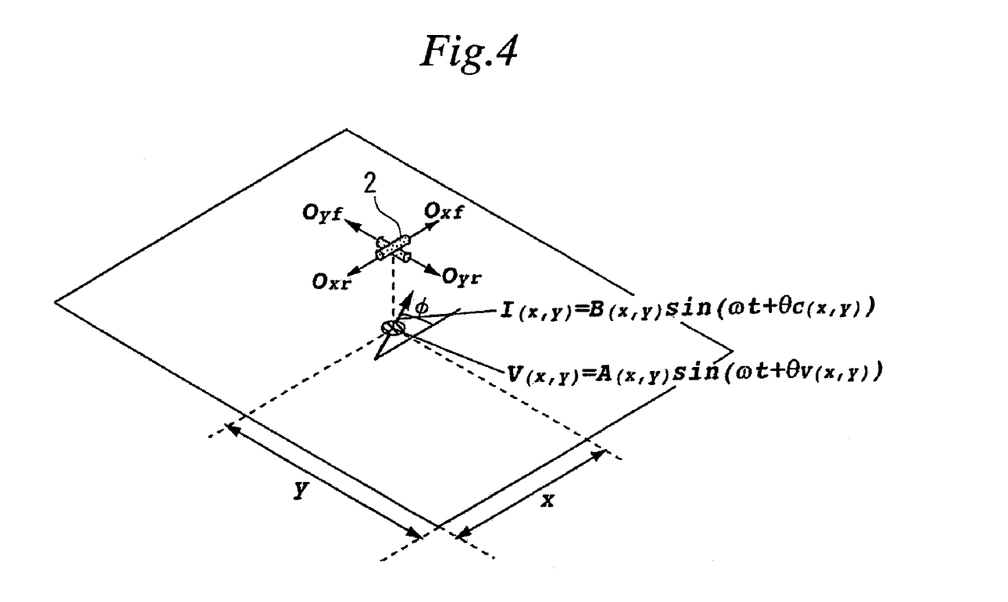
FIG. 4 is another diagram illustrating the working principle of the invention.

The first mode for carrying out the present invention will be described with reference to FIG. 1 through FIG. 5. FIG. 1 and FIG. 2 are configurational diagrams of the apparatus for measuring the distribution of electromagnetic field intensities; FIG. 3 and FIG. 4, diagrams illustrating the working principle of the invention; and FIG. 5, a diagram illustrating the configuration of a probe.

First will be explained the working principle of the invention with reference to FIG. 3 and FIG. 4. Now it is assumed that, as shown in FIG. 3, there are a voltage V (=A sin(ωt+θ_v)) and a current I (=B sin(ωt+θ_c)) of a certain frequency at a point in an object of measurement (sample device) 1. A minute linear conductor 2 both ends of which are terminated at equal impedances is arranged immediately above this point. Then in the conductor 2, a current $I_e$ is generated through electric field coupling with the voltage V (hereinafter referred to as "electric field component current") and a current $I_m$ is generated through magnetic field coupling with the current I (hereinafter referred to as "magnetic field component current"). Therefore, output currents $O_1$ and $O_2$ from the two ends of the conductor 2 become composite currents of the electric field component current $I_e$ and the magnetic field component current $I_m$. Here, while the electric field component currents $I_e$ outputted from the two ends of the conductor 2 are in the same phase, the magnetic field component currents $I_m$ are reverse in phase to each other. Thus, while the electric field component currents $I_e$ vary according to the direction of the conductor, the magnetic field component current $I_m$ is independent of the direction of the conductor 2. The present invention, making use of this feature, estimates the electric field intensity and the magnetic field intensity in the position of the conductor 2 and the current and the voltage of the object 1 in a position opposite the conductor 2 by calculating the electric field component current and the magnetic field component current on the basis of the plurality of output currents differing from one another in the outputting direction. The method will be described in further detail below.

Referring to FIG. 3, the output currents $O_1$ and $O_2$ outputted from the two ends of the conductor 2 are represented by Equations (1) and (2), respectively:

$$O_1 = \alpha A \sin(\omega t+\theta_v) + \beta B \sin(\omega t+\theta_c) \quad (1)$$

$$O_2 = \alpha A \sin(\omega t+\theta_v) - \beta B \sin(\omega t+\theta_c) \quad (2)$$

Here, α and β are coefficients. Therefore, by calculating the sum and difference between the output currents $O_1$ and $O_2$ at the two ends as in Equations (3) and (4), respectively, the electric field component current $I_e$ and the magnetic field component current $I_m$ flowing in the conductor 2 can be calculated. However, the values of the output currents $O_1$ and $O_2$ then should be vector values. Thus, it is necessary to measure the phase difference between the output currents $O_1$ and $O_2$:

$$I_e = (O_1 + O_2)/2 \quad (3)$$

$$I_m = (O_1 - O_2)/2 \quad (4)$$

By using this minute conductor 2 as a probe, the electromagnetic field intensity in the position of the conductor 2 and the current and the voltage under this conductor 2 can be estimated.

Next will be described with reference to FIG. 4 a case in which the direction of the current on a plane is to be considered. Now it is assumed that there are at a point (x, y) on an XY plane a voltage V ($=A_{(x,y)} \sin(\omega t + \theta_v)$) and a current I($=B_{(x,y)} \sin(\omega t + \theta_c)$) flowing in the φ direction. In this case, the relationships measured, with the conductor 2 rotated immediately above the point (x, y), in two mutually orthogonal directions can be expressed in Equations (5) through (8) below:

$$O_{xf} = \alpha A_{(x,y)} \sin(\omega t + \theta_{v(x,y)}) - \beta B_{(x,y)} \sin(\omega t + \theta_{c(x,y)}) \cos \phi \quad (5)$$

$$O_{xr} = \alpha A_{(x,y)} \sin(\omega t + \theta_{v(x,y)}) + \beta B_{(x,y)} \sin(\omega t + \theta_{c(x,y)}) \cos \phi \quad (6)$$

$$O_{yf} = \alpha A_{(x,y)} \sin(\omega t + \theta_{v(x,y)}) - \beta B_{(x,y)} \sin(\omega t + \theta_{c(x,y)}) \sin \phi \quad (7)$$

$$O_{yr} = \alpha A_{(x,y)} \sin(\omega t + \theta_{v(x,y)}) + \beta B_{(x,y)} \sin(\omega t + \theta_{c(x,y)}) \sin \phi \quad (8)$$

These relationships determine the relationships among Equations (9) through (11):

$$O_{xf} + O_{xr} = O_{yf} + O_{yr} = 2\alpha A_{(x,y)} \sin(\omega t + \theta_{v(x,y)}) \quad (9)$$

$$O_{xf} - O_{xr} = -2\beta B_{(x,y)} \sin(\omega t + \theta_{c(x,y)}) \cos \phi \quad (10)$$

$$O_{yf} - O_{yr} = -2\beta B_{(x,y)} \sin(\omega t + \theta_{c(x,y)}) \sin \phi \quad (11)$$

Therefore, by solving these formulas, the electromagnetic field intensity in the position of the conductor 2, the current and the voltage and the direction of the current at the point (x, y) can be estimated. Then, by conducting measurement while causing this conductor 2 to scan and rotate on a parallel plane immediately above the object, the distribution can be determined.

Next will be described a measuring apparatus pertaining to the present invention with reference to FIG. 1 and FIG. 2. This measuring apparatus is intended for measuring the intensity distribution in the electromagnetic field in the vicinity of a sample device 10. The sample device 10 may be, for instance, the circuit board of an electronic device. During measurement, the sample device 10 is kept in an operating state, and the intensity of the electromagnetic field formed by the electromagnetic wave radiated during the operation of the sample device 10 is measured.

This measuring apparatus is provided with a measuring probe 20, a reference signal probe 30, both arranged in the vicinity of the sample device 10, a frequency converter 40 connected to the measuring probe 20 and the reference signal probe 30, an oscillator 41 for supplying a reference signal to the frequency converter 40, a meter 50 to be connected to the frequency converter 40, a computer 60 connected to the meter 50, a shifting device (not shown) for shifting the measuring probe 20 in the XY direction in the vicinity of the sample device 10.

In addition to the elements enumerated above, a plurality of measuring probes 20 may as well be arranged in a matrix form over the sample device 10. In this case, the electromagnetic field either in the whole sample device 10 or a selected region of the sample device 10, the selection being accomplished with a switch or the like, can be detected. This configuration would dispense with the shifting device for shifting the measuring probe 20 in the XY direction, making it easier to reduce the size of the apparatus.

Figure 5:
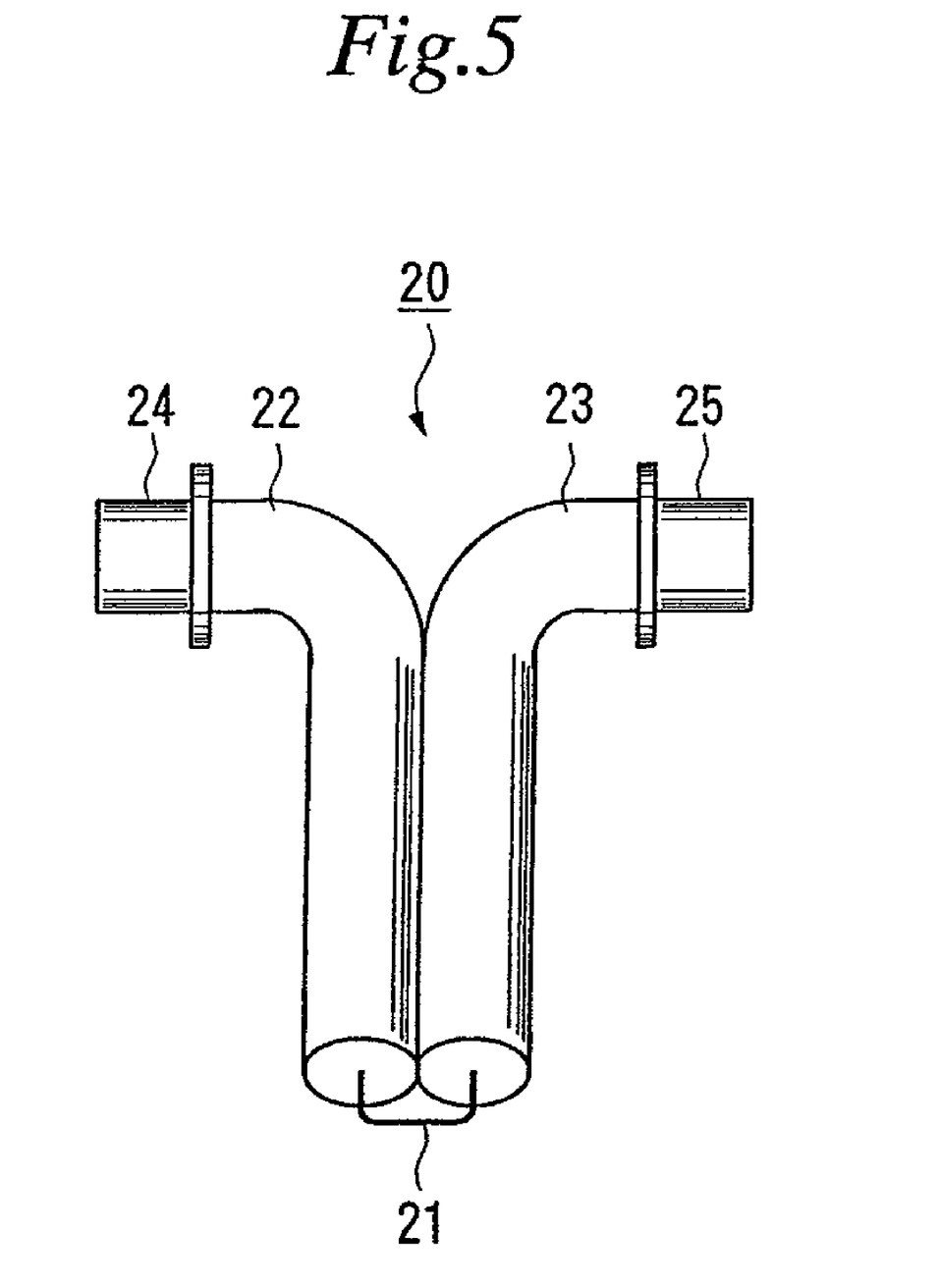
FIG. 5 is a diagram illustrating a probe pertaining to the first mode for carrying out the invention.

The measuring probe 20, as shown in FIG. 5, has a loop antenna 21. This loop antenna 21 is a loop-shaped conductor provided with no shield. In this mode for carrying out the invention, as the loop antenna 21, a rectangularly shaped loop antenna is used to enable it to be disposed closer to the sample device 10. The two ends of the loop antenna 21 are connected to the core conductors of the coaxial cables 22 and 23, respectively. At the other end of each of the coaxial cables 22 and 23, there is provided a connector 24 or 25. The connectors 24 and 25 are connected to the frequency converter 40 via coaxial cables 26 and 27 (see FIG. 1), respectively. Here, the characteristic impedance between one end of the loop antenna 21 and the frequency converter 40 and the characteristic impedance between the other end of the loop antenna 21 and the frequency converter 40 are identical. In this mode for carrying out the invention, the measuring probe 20 is fabricated by using a coaxial cable of which the external conductor is made of copper, the dielectric is made of fluorocarbon resin, the characteristic impedance being 50Ω and the diameter is about 1 mm.

The reference signal probe 30 is intended to detect a reference signal by being arranged in the vicinity of the sample device 10. This reference signal serves as the reference for measuring the phase differences between the plurality of output signals outputted from the measuring probe 20. The output signals detected with the measuring probe 20 are high frequency signals in the 7 to 3 GHz band as will be described afterwards, signals whose frequencies are unstable and whose phases are difficult to measure with a conventional measuring apparatus, because such output signals contain electromagnetic field components and, moreover, phase components which vary over time. If the phase components, which constitute one reason for this instability of the output signals, are eliminated, it will become possible to measure the phase of each output signal, and therefore it will become possible to measure phase differences between the signals. In order to eliminate the phase component contained in each output signal, the reference signal probe is provided, and by comparing and subjecting to arithmetic operation the output signals and the reference signal in the position of the probe relative to the position of the reference signal probe with the reference signal obtained from this reference signal probe, unnecessary phase components are eliminated to make the phase of each output signal measurable. Therefore, the reference signal probe 30, unlike the measuring probe 20, is fixed in a prescribed position without being shifted during measurement. In actual measurement, it is preferable to obtain the reference signal by detecting the high frequency signals radiated from the sample device 10 measured by the measuring probe 20. In this manner, by measuring the same high frequency signals, the same unnecessary phase components can be detected and canceled out with each other. The reference signal probe 30, for instance, may be a loop antenna or the like. The reference signal probe 30 is connected to the frequency converter 40 via a coaxial cable 31.

The reference signal probe 30 shown in FIG. 1 as an example is configured of a loop antenna. And this reference signal probe 30 is arranged in the vicinity of the sample device 10 to detect a magnetic field generated in the vicinity of the sample device 10. Then, the reference signal is generated from the signals obtained by magnetic field detection. However, the reference signal may as well be obtained in some other way. Another method for obtaining the reference signal will be described below with reference to FIG. 10 and FIG. 11.

Figure 10:
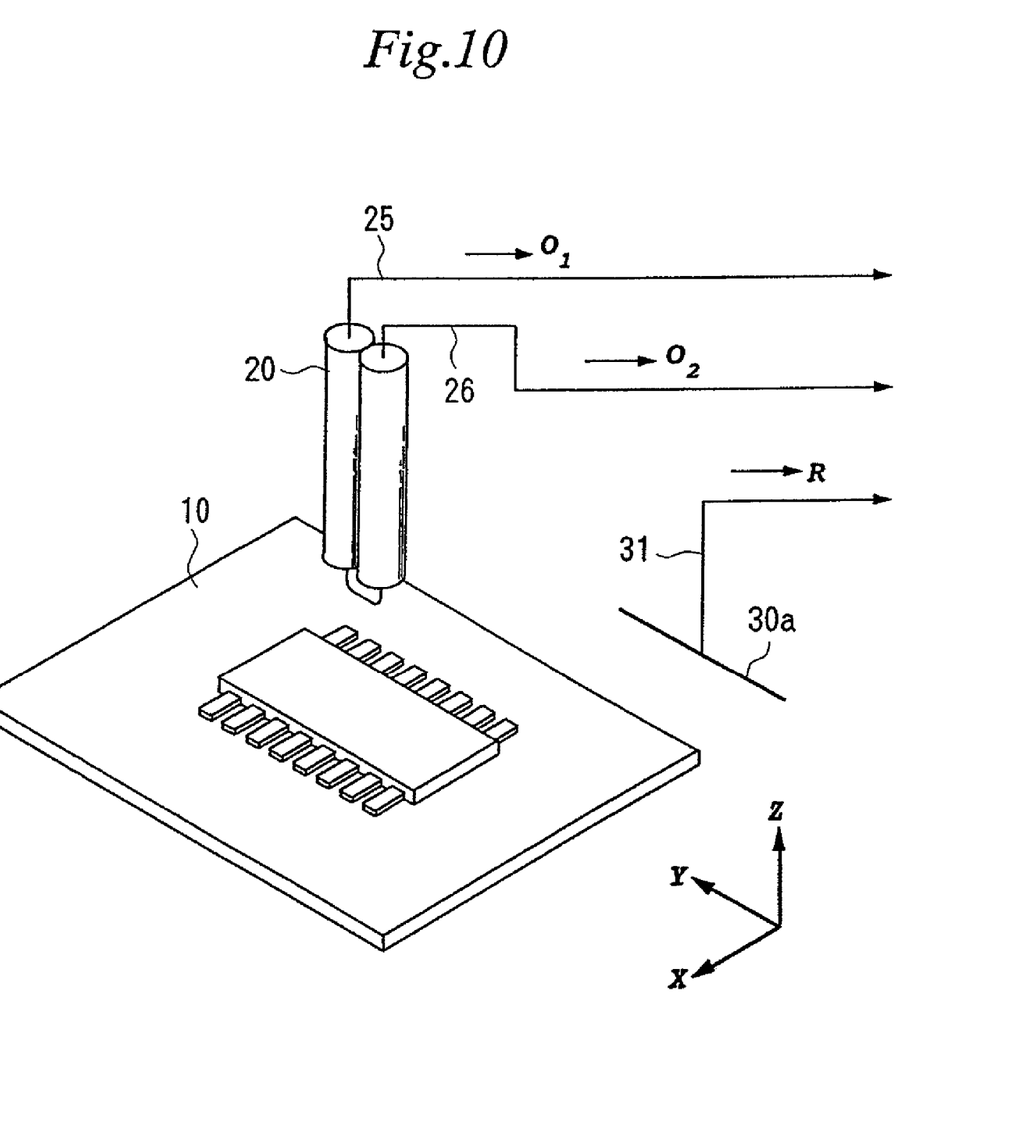
FIG. 10 is a diagram illustrating a modification of the apparatus for measuring the distribution of electromagnetic field intensities pertaining to the first mode for carrying out the invention.

FIG. 10 is a diagram illustrating a modification of the apparatus for measuring the distribution of electromagnetic field intensities pertaining to the first mode for carrying out the invention. In this diagram, the same elements as in FIG. 1 are denoted by respectively the same reference numerals. In the example shown in FIG. 10, a fixed antenna 30a is used as the reference signal probe. This fixed antenna 30a is connected to the frequency converter 40.

This configuration eliminates the need to arrange in the vicinity of the sample device 10 the fixed antenna 30a for obtaining the reference signal. Therefore, it is made possible to detect an external magnetic field farther toward the periphery than the vicinity of the sample device 10 and to generate the reference signal from that detected signal. The elimination of the need to arrange the reference signal probe in the vicinity of the sample device frees the measuring probe from the restriction on shifting. Its arrangement away from the measuring probe serves to prevent mutual interference.

Figure 11:
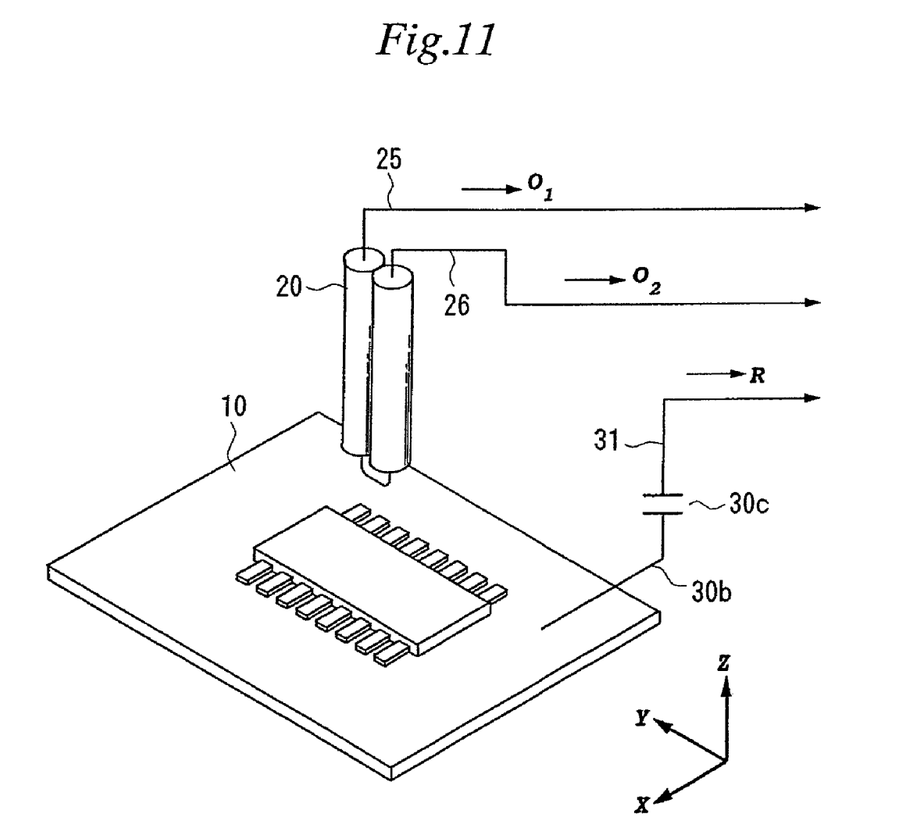
FIG. 11 is a diagram illustrating another modification of the apparatus for measuring the distribution of electromagnetic field intensities pertaining to the first mode for carrying out the invention.

FIG. 11 is a diagram illustrating another modification of the apparatus for measuring the distribution of electromagnetic field intensities pertaining to the first mode for carrying out the invention. In this diagram, the same elements as in FIG. 1 are denoted by respectively the same reference numerals. In the example shown in FIG. 11, a wire 30b to be connected to the substrate pattern of the sample device 10 and a capacitor 30c of which one end is connected to the wire 30b are used as the reference signal probe. And the other end of the capacitor 30c is connected to the frequency converter 40. This configuration enables the capacitor 30c to cut the DC component of the reference signal and thereby to generate a stable reference signal. The configuration shown in FIG. 11 is especially suitable for use in a case where the magnetic field generated from the sample device 10 is weak, and it is made possible to generate the reference signal by detecting the electric field component from the substrate pattern. In addition, while FIG. 11 illustrates a case in which the reference signal probe is provided with the capacitor 30c, it need not use a capacitor but may as well use an inductor or a filter. It is preferable, however, to use the capacitor 30c in order to cut the DC component of the reference signal and thereby to generate a stable reference signal.

The frequency converter 40 is provided with a branching filter 42 for branching the reference signal inputted from the oscillator 41, and mixers 43, 44 and 45 for mixing output signals inputted from the measuring probe 20 and the reference signal probe 30 with the reference signal inputted from the branching filter 42 to carry out frequency conversion. As the mixers 43, 44 and 45 here use the same reference signal, the phase difference between the output signals from the probes 20 and 30 can be maintained even after the frequency conversion. This makes it possible to keep the phase difference between the signals constant even where the output signal detected by the measuring probe 20 is a high frequency signal and phase differences between a plurality of output signals are to be measured, resulting in stable and reliable measurement. In addition, in this mode for carrying out the invention, the measurable frequency band is supposed to range from 7 MHz to 3 GHz, and the frequency of the output signal of the oscillator 41 is so set that the intermediate frequency of the output signals of the mixers 43, 44 and 45 be 5 MHz.

The meter 50 is provided with A/D converters 51, 52 and 53 for subjecting each of the output currents $O_1$ and $O_2$ from the measuring probe 20 and the output current R from the reference signal probe 30 to A/D conversion. Each of the A/D converters 51, 52 and 53 operates in accordance with a reference clock from the same oscillator 54. This enables the phase difference between the output signals of the probes 20 and 30 to be maintained even if the output currents are subjected to digital conversion in the meter 50. This makes it possible to keep the phase difference between the signals constant even where the output signal detected by the measuring probe 20 is a high frequency signal and phase differences between a plurality of output signals are to be measured, resulting in stable and reliable measurement. Further, the meter 50 is provided with amperage measuring units 55 and 56 for measuring the magnitudes of the output currents $O_1$ and $O_2$ from the measuring probe 20 in a prescribed frequency band and phase difference measuring units 57 and 58 for measuring the phase differences between the output currents $O_1$ and $O_2$ and the output current R from the reference signal probe 30. The results of measurement by the measuring units 51 through 54 are outputted to the computer 60.

The computer 60 is provided with a memory unit 61 for storing the output result from the meter 50 and the result of arithmetic operation by an arithmetic unit 62, the arithmetic unit 62 for computing the electric field intensity and the magnetic field intensity in the arranged position of the measuring probe 20 on the basis of the output result from the meter 50 stored in the memory unit 61, a shift control unit 63 for controlling the shifting device (not shown) for the measuring probe 20, and a display unit 64 for displaying the result of the arithmetic operation. The arithmetic operation by the arithmetic unit 62 is carried out in accordance with the working principle of the invention. In this manner, the electromagnetic field intensity distribution and the phase distribution in the vicinity of the sample device 10 are stored in the memory unit 61.

Next will be described a measuring method for electromagnetic field intensity using the measuring apparatus in this mode for carrying out the invention. First, the measuring probe 20 is arranged in the vicinity of the sample device 10 in the operating state. Further, the reference signal probe 30 is also arranged in the vicinity of the sample device 10. Then, while shifting the measuring probe 20 with the shifting device (not shown), the amperages of and the phase differences between the respective output signals of the measuring probe 20 and the reference signal probe 30 are measured with the meter 50, and the results of measurement are stored into the memory unit 61 of the computer 60. In this process, the measuring probe 20 is shifted in parallel on the XY plane in the vicinity of the sample device 10, and shifting direction is not changed. On the other hand, the reference signal probe 30 is not shifted. Next, the measuring probe 20 is rotated by 90° around an axis in the z direction. Then, while shifting the measuring probe 20 with the shifting device (not shown) in the same way as in the previous measuring process, the amperages of and the phase differences between the respective output signals of the measuring probe 20 and the reference signal probe 30 are measured with the meter 50, and the results of measurement are stored into the memory unit 61 of the computer 60. Next, the arithmetic unit 62 performs arithmetic operation in accordance with the working principle of the invention explained above on the basis of the measurement results stored in the memory unit 61. The procedure described so far provides 1) the electric field intensity distribution, 2) the electric field phase distribution, 3) the magnetic field intensity distribution and 4) the magnetic field phase distribution in the vicinity of the sample device 10. From these items of information, it is possible to obtain, in accordance with the working principle of the invention explained above, 5) the current distribution, 6) the current direction distribution and 7) the voltage distribution on the surface of the sample device 10 opposite the measuring probe 20.

Thus, the electromagnetic field intensity measuring apparatus pertaining to the present invention can easily and accurately measure the magnitudes of the output currents $O_1$ and $O_2$ and the phase difference between the output currents $O_1$ and $O_2$ by simultaneously measuring the plurality of output currents $O_1$ and $O_2$ outputted from the measuring probe 20 and the output current R of the reference signal probe 30. Thus, though it is difficult to measure the phases of the plurality of output signals themselves outputted from the measuring probe 20, unnecessary phase components are eliminated by comparing and subjecting to arithmetic operation the output signals and the reference signal in the position of the measuring probe 20 relative to the position of the reference signal probe 30, and it is thereby made possible to measure the phases of the output signals, with the result that the phase difference between the two output currents can also be measured.

Then on the basis of the phase difference between the measured magnitudes of the output currents $O_1$ and $O_2$ and the reference output current R, it is possible to accurately calculate the electric field component current and the magnetic field component current generated in the measuring probe 20. This enables the electric field intensity distribution, the electric field phase distribution, the magnetic field intensity distribution and the magnetic field phase distribution in the position of the measuring probe 20 to be determined. Also from these items of information, it is possible to obtain the current distribution, the current direction distribution and the voltage distribution on the surface of the sample device 10 opposite the measuring probe 20.

Second Mode for Carrying Out the Invention

Figure 6:
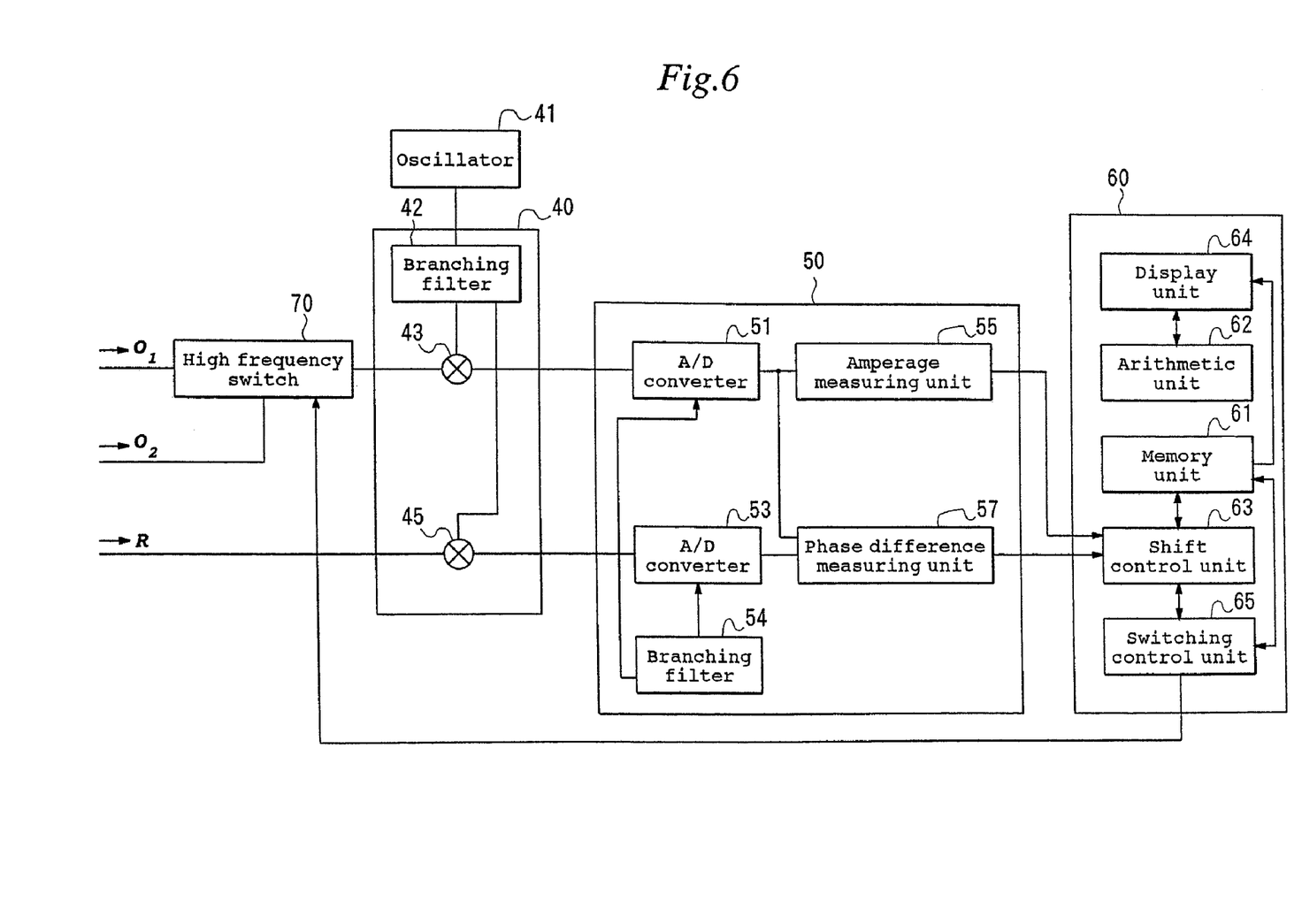
FIG. 6 is a diagram illustrating the configuration of an apparatus for measuring the distribution of electromagnetic field intensities pertaining to a second mode for carrying out the invention.

FIG. 6 is referred to in describing a second mode for carrying out the invention. FIG. 6 is a diagram illustrating the configuration of an apparatus for measuring the distribution of electromagnetic field intensities. In FIG. 6, the same elements as in the first mode for carrying out the invention are denoted by respectively the same reference numerals, and their description is dispensed with.

The electromagnetic field intensity measuring apparatus in this mode for carrying out the invention differs from that in the first mode for carrying out the invention in that the output currents $O_1$ and $O_2$ from the measuring probe 20 are separately measured. However, each of the output currents $O_1$ and $O_2$ from the measuring probe 20 is measured simultaneously with the output current R of the reference signal probe 30. This makes it possible to measure the phase difference between the output currents $O_1$ and $O_2$ in the same way as in the first mode for carrying out the invention.

This measuring apparatus, as shown in FIG. 6, is provided with a two-input one-output high frequency switch 70 in the stage preceding the frequency converter 40. Further, the computer 60 is provided with a switching control unit 65 for controlling the high frequency switch 70. Since this configuration provides the meter 50 with two inputs, one each of the A/D converters, amperage measuring units and phase difference measuring units in the first mode for carrying out the invention is dispensed with.

In carrying out measurement with such a measuring apparatus, the measurement is performed while controlling the switching by the high frequency switch 70 with the switching control unit 65. This makes it possible to obtain the same items of information as those available in the first mode for carrying out the invention, i.e. the magnitudes of the output currents $O_1$ and $O_2$ and the phase differences of the output currents $O_1$ and $O_2$ from the output current R. Therefore, after that, arithmetic operation by the arithmetic unit 62 as in the first mode for carrying out the invention would provide similar measurement results to what are obtained in the first mode for carrying out the invention.

Thus, with the measuring apparatus in this mode for carrying out the invention, the configuration of the meter 50 can be simplified. Since this kind of meter 50 is very expensive, the measuring apparatus in this mode for carrying out the invention makes possible measurement of the electromagnetic field intensity distribution at lower cost. Other advantages of this mode are similar to those in the first mode for carrying out the invention.

Third Mode for Carrying Out the Invention

Figure 7:
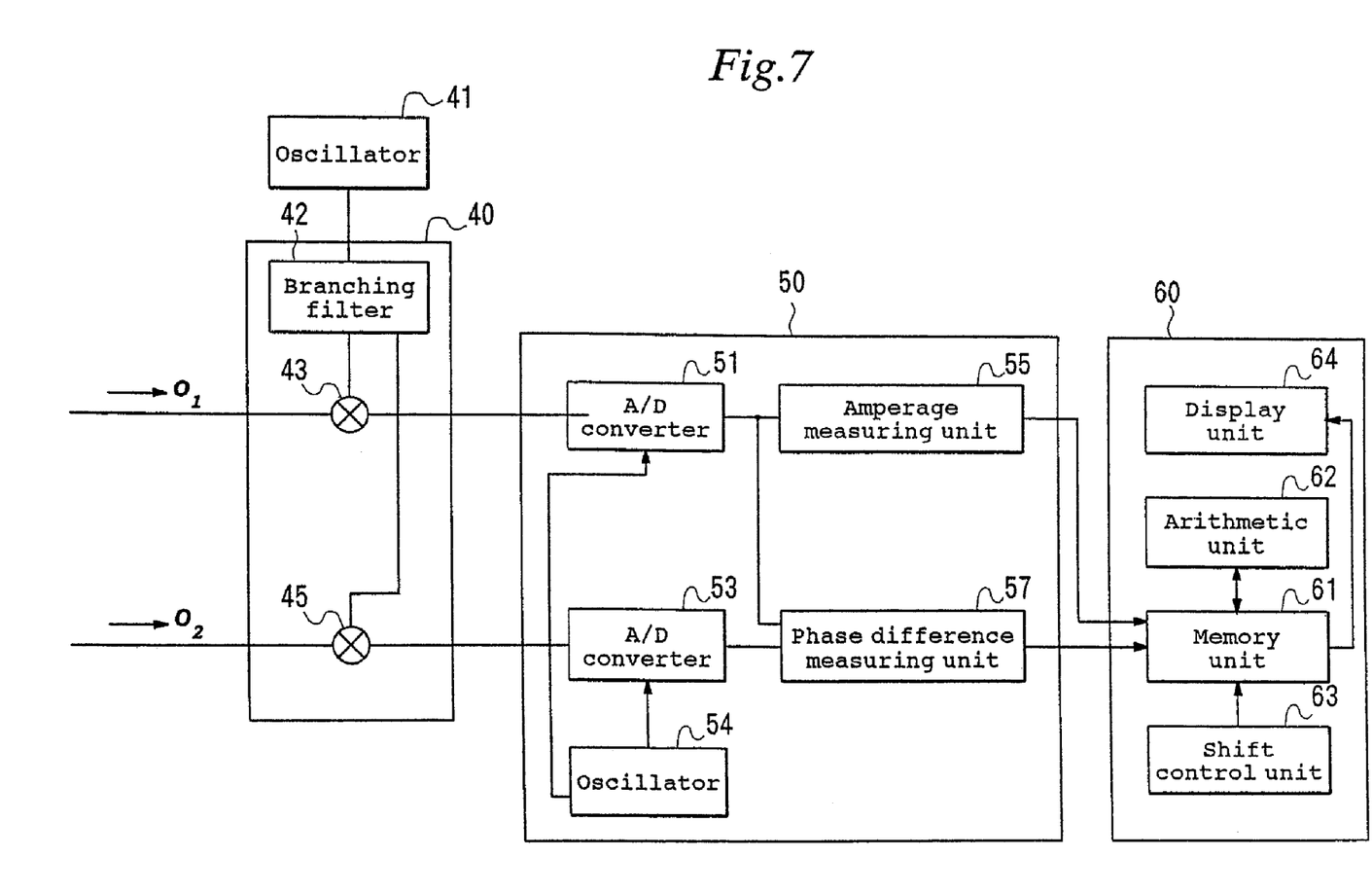
FIG. 7 is a diagram illustrating the configuration of an apparatus for measuring the distribution of electromagnetic field intensities pertaining to a third mode for carrying out the invention.

FIG. 7 is referred to in describing a third mode for carrying out the invention. FIG. 7 is a diagram illustrating the configuration of another apparatus for measuring the distribution of electromagnetic field intensities. In FIG. 7, the same elements as in the first mode for carrying out the invention are represented by respectively the same signs, and their description is dispensed with.

The apparatus for measuring the electromagnetic field intensities in this mode for carrying out the invention differs from that in the first mode for carrying out the invention in that it is provided with no reference signal probe 30 and that the phase difference between the output currents $O_1$ and $O_2$ is measured by simultaneously measuring the output currents $O_1$ and $O_2$ from the measuring probe 20. Since this configuration provides the meter 50 with two inputs, one each of the A/D converters, amperage measuring units and phase difference measuring units in the first mode for carrying out the invention is dispensed with.

Although this measuring apparatus makes possible measurement of the electric field intensity and the magnetic field intensity at a certain point, it cannot determine the electric field phase distribution or the magnetic field phase distribution unlike in the first mode for carrying out the invention because it does not measure the output current R of the reference signal probe 30. However, it is useful in that the system can be configured more simply and less expensively in comparison with that in the first mode for carrying out the invention since it is not always necessary to determine the phase distribution.

Fourth Mode for Carrying Out the Invention

Figure 8:
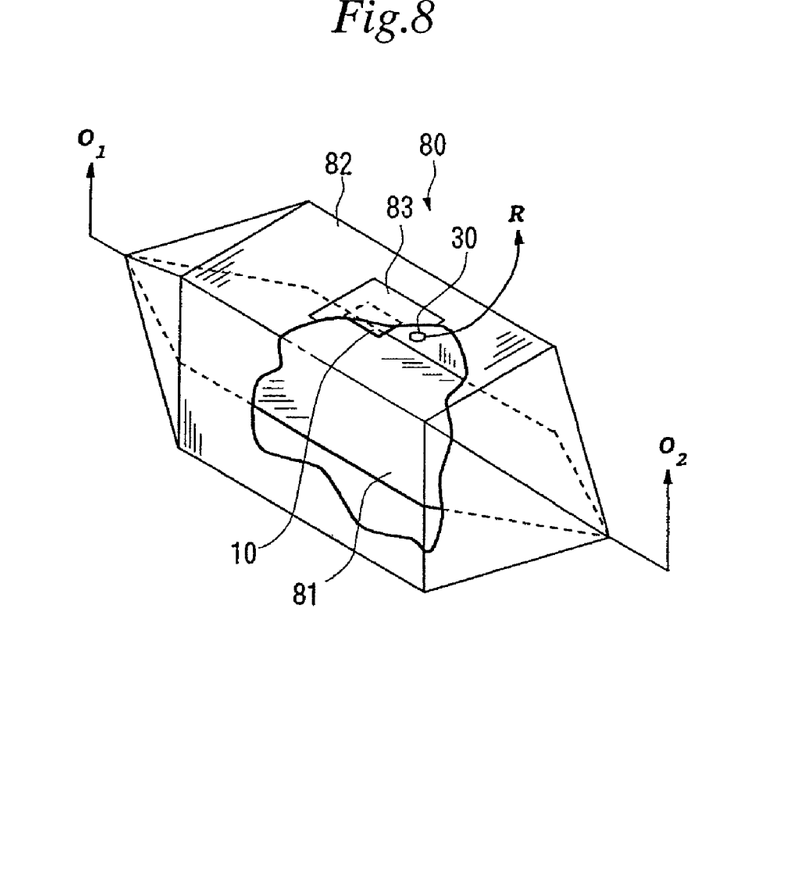
FIG. 8 is a diagram illustrating a TEM cell pertaining to a fourth mode for carrying out the invention.

FIG. 8 is referred to in describing a fourth mode for carrying out the invention. FIG. 8 shows a partly notched perspective view of the structure of a TEM cell.

The measuring apparatus in this mode for carrying out the invention differs from the first through fourth modes for carrying out the invention in the configuration of the electromagnetic field detecting unit. Thus, while the measuring probe 20 is used in the first through fourth modes for carrying out the invention, a TEM cell 80, which is a sort of coaxial transmission line, is used in this mode for carrying out the invention. The sample device 10 is housed in the TEM cell 80. The TEM cell 80 is a rectangular transmission line of 50Ω in characteristic impedance. Thus, the TEM cell 80 is provided with a core conductor 81 and an external conductor 82. The top face of the TEM cell 80 is provided with a square lid 83. In the central part inside the lid 83 is installed the sample device 10. This sample device 10 is arranged between the external conductor 82 and the core conductor 68. Within the TEM cell 80 is arranged the reference signal probe 30.

With such a configuration, the electric field intensity and the magnetic field intensity can be obtained by inputting to the measuring system illustrated in FIG. 2 the output currents outputted from the two ends of the TEM cell 80 and the output signal of the reference signal probe 30. In this case, the shift control unit 63 of the computer 60 shown in FIG. 2 is unnecessary.

Similarly, by inputting to the measuring system illustrated in FIG. 6 the output current outputted from one end of the TEM cell 80 and the output signal outputted from the reference signal probe 30 while rotating the lid 83 by 90° at a time, the electric field intensity and the magnetic field intensity can be obtained. In this case, the other end of the TEM cell 80 is terminated with a prescribed characteristic impedance. In this case, too, the shift control unit 63 of the computer 60 shown in FIG. 6 is unnecessary.

Further by inputting to the measuring system illustrated in FIG. 7 the output currents outputted from the two ends of the TEM cell 80 while rotating the lid 83 by 90° at a time, the electric field intensity and the magnetic field intensity can be obtained. In this case, the shift control unit 63 of the computer 60 shown in FIG. 7 is unnecessary.

Thus, the measuring apparatus in this mode for carrying out the invention, though it cannot obtain the distribution in the vicinity of the sample device unlike that in the first mode for carrying out the invention, can measure the overall electromagnetic field intensity formed by the sample device.

Figure 9:
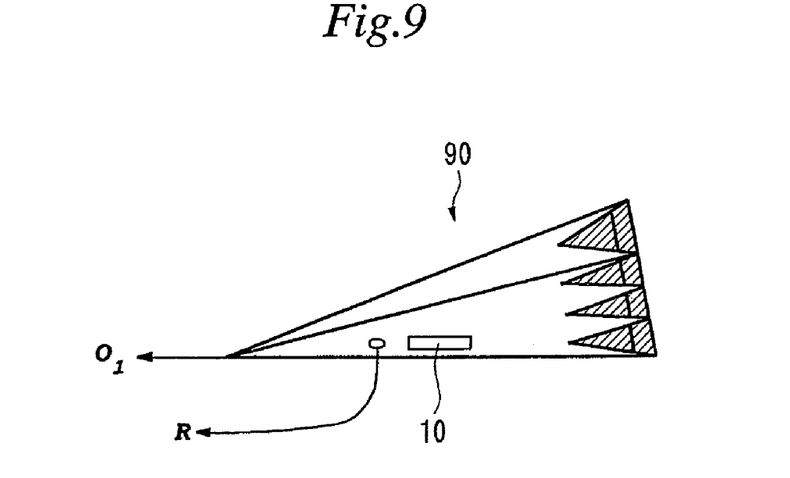
FIG. 9 is a diagram illustrating a G-TEM cell pertaining to another example of the fourth mode for carrying out the invention.

While the TEM cell 80 as the coaxial transmission line is used in this mode for carrying out the invention, a G-TEM cell 90 shown in FIG. 9 may as well be used.

Although the invention has hitherto been described with reference to various modes for carrying it out, these modes have been cited merely for the illustrative purpose, but do not limit the scope of the invention. The scope of the invention is set forth in the claims, and every modification that can be covered by any of the claims is included in the invention.

For instance, although a loop antenna fabricated by working on a coaxial cable is used as the measuring probe 20 in any of the first through fourth modes for carrying out the invention, the invention is not confined to it. It may be a conductor in any shape or structure only if its electromagnetic field generates a current. Thus, since the electric field component current generated by the electric field and the magnetic field component current generated by the magnetic field can be separated from each other in calculation according to the principle of measurement according to the invention, there is no need for the structure according to the prior art in which a loop antenna and a dipole antenna positively detect the electric field component current and the magnetic field component current, respectively. For this reason, a very small probe can be readily fabricated according to the invention. This results in the significant advantage of improved resolution.

Also, while the measuring probe 20 is manually rotated by 90° in the first through fourth modes for carrying out the invention, a rotating apparatus may as well be provided and subjected to control by the computer 60.

Further, although the output currents from both ends of the measuring probe 20 are measured in the first through fourth modes for carrying out the invention, the output current from only one end may be measured as well. Since the invention requires a plurality of currents outputted in different directions relative to the sample device 10, the measuring probe 20 can be rotated either manually or with a rotating apparatus by 90°, 180° or 270°.

Also, while the electromagnetic field distribution in two dimensions is obtained by shifting the measuring probe 20 on the XY plane in the first through fourth modes for carrying out the invention, it can be shifted additionally in the Z direction to obtain the electromagnetic field distribution in three dimension.

As described in detail so far, according to the present invention, by simultaneously measuring a plurality of output currents outputted from a conductor in mutually different directions, their magnitudes and the phase difference between the output currents can be measured. And on the basis of the magnitude of each output current and the phase difference between the output currents, the electric field component current and the magnetic field component current contained in the output currents can be computed, and it is thereby made possible to measure accurately the electromagnetic field in the position of the conductor.

Further the invention can provide a measuring method and apparatus for electromagnetic field intensity, a measuring method and apparatus for electromagnetic field intensity distribution, and a measuring method and apparatus for current and voltage distributions, all of which permit ready and reliable measurement of the phases of signals radiated from a sample device even if the frequency of the signals is unstable.

The invention claimed is:

1. A measuring apparatus for the electric field intensity and the magnetic field intensity of an electromagnetic field, comprising:

a conductor adapted to be within and responsive to the electromagnetic field, said conductor including a measuring conductor arranged in a measuring position;

a reference signal conductor for detecting a reference signal:

and a measuring arrangement for simultaneously measuring (a) a plurality of output currents adapted to be derived by the conductor in different directions relative to the electromagnetic field, and (b) the reference signal detected by the reference signal conductor, the simultaneous measurements being of the magnitude of each output current and the phase difference between each output current and the reference signal;

a calculating arrangement for (a) calculating, on the basis of the measured magnitudes of the plurality of output currents and the phase differences, an electric field component current generated in the conductor by an electric field contained in each output current and a magnetic field component current generated in the conductor by a magnetic field, and (b) calculating, on the basis of the calculated magnitudes of the electric field component current and the magnetic field component current, the electric field intensity and the magnetic field intensity of the electromagnetic field.

2. The measuring apparatus for electromagnetic field intensity, as set forth in claim 1, wherein:

said measuring arrangement is arranged to derive a signal, which is obtained by said measuring conductor and has an electromagnetic field component and a phase component varying over time, of said phase component by using said reference signal.

3. The measuring apparatus for electromagnetic field intensity, as set forth in claim 1, wherein:

said reference signal conductor includes an antenna.

4. The measuring apparatus for electromagnetic field intensity, as set forth in claim 1, wherein:

said reference signal conductor includes an antenna configured as a loop-shaped conductor.

5. The measuring apparatus for electromagnetic field intensity, as set forth in claim 1, wherein:

said, reference signal conductor includes a capacitor.

6. The measuring apparatus for electromagnetic field intensity, as set forth in claim 1, wherein:

said conductor is arranged in the vicinity of a sample device and the measuring arrangement is arranged for measuring the intensity of an electromagnetic field formed by an electromagnetic wave radiated from the sample device.

7. The measuring apparatus for electromagnetic field intensity, as set forth in claim 6, wherein said conductor includes the internal conductor of a coaxial transmission line and the sample device is arranged between the internal conductor and the external conductor of the coaxial transmission line.

8. The measuring apparatus for electromagnetic field intensity, as set forth in claim 7, wherein said conductor includes a TEM cell.

9. The measuring apparatus for electromagnetic field intensity, as set forth in claim 7, wherein said conductor includes a G-TEM cell of claim 1 in combination with an arrangement for determining the electric field intensity distribution, the arrangement for determining the electric field intensity distribution including a conductor shifting arrangement.

10. The measuring apparatus for electromagnetic field intensity, as set forth in claim 1, wherein:

said measuring conductor includes a loop-shaped conductor.

11. The measuring apparatus for electromagnetic field intensity distribution as set forth in claim 1 and further including:

a shifting structure for shifting said conductor within the electromagnetic field intensities.

12. The combination of claim 11, wherein the conductor shifting arrangement is arranged for shifting said measuring conductor while said reference signal conductor is kept fixed to measure the distribution of electromagnetic field intensities and the distribution of phases.

13. The combination of claim 12 wherein said conductor is arranged in the vicinity of a sample device and the measuring arrangement is arranged for measuring the intensity of an electromagnetic field formed by an electromagnetic wave radiated from a sample device, further including a measuring apparatus for current and voltage distributions associated with the electromagnetic field, the measuring apparatus for current and voltage distributions associated with the electromagnetic field including a calculating arrangement for calculating current and voltage amplitudes present in a part of the sample device opposite to the conductor on the basis of the calculated electromagnetic field intensity.

* * * * *